United States Patent [19]

Boldish et al.

[11] Patent Number: 4,777,022
[45] Date of Patent: Oct. 11, 1988

[54] EPITAXIAL HEATER APPARATUS AND PROCESS

[75] Inventors: Steven I. Boldish, Plano, Tex.; Joseph S. Ciofalo, Cerritos, Calif.

[73] Assignee: Stephen I. Boldish, Plano, Tex.

[21] Appl. No.: 644,943

[22] Filed: Aug. 28, 1984

[51] Int. Cl.⁴ .................. C30B 23/06; C30B 35/00
[52] U.S. Cl. .................... 422/245; 118/716; 118/719; 118/725; 118/728; 373/117; 373/159
[58] Field of Search ............. 422/245; 118/716, 719, 118/725, 728; 373/151, 152, 117, 159

[56] References Cited

U.S. PATENT DOCUMENTS

| | | | |
|---|---|---|---|
| 3,233,578 | 2/1966 | Capita | 118/725 |
| 3,235,418 | 2/1966 | Nickl et al. | 118/725 |
| 3,436,255 | 4/1969 | Harris et al. | 117/201 |
| 3,456,616 | 7/1969 | Gleim et al. | 118/725 |
| 3,641,974 | 2/1972 | Yamada et al. | 118/48 |
| 4,100,879 | 7/1978 | Goldin et al. | 118/49.1 |
| 4,147,571 | 4/1979 | Stringfellow et al. | 148/175 |
| 4,264,393 | 4/1981 | Gorin et al. | 156/345 |
| 4,348,981 | 9/1982 | Nakanisi et al. | 118/730 |

FOREIGN PATENT DOCUMENTS 60-112691 6/1985 Japan ................. 118/728

OTHER PUBLICATIONS

Mellor, Inorganic and Theoretical Chemistry, vol. XI, Longmans, Green and Co., New York, 1948, p. 518.
Katchmer, "A Low-Cost Aerospace Heater", Microwaves & RF, Sep. 1983.
"Quartz Envelope for MOCVD", Semiconductor International, Oct. 1983 at 34.
Inside R & D, Fort Lee, New Jersey, Aug. 3, 1983.
S. I. Boldish, J. S. Ciofalo and D. H. Barker, "The Quartz Envelope Heater: A New Heating Technique for MOCVD Systems", technical report for The Aerospace Corporation, releasable through the NTIS, Report No. SD-TR-83-31, dated May 16, 1983.
"2 Devise Better Way to Heat Substrate", The Aerospace Corporation Orbiter, Jul. 20, 1983.

Primary Examiner—John Doll
Assistant Examiner—Robert M. Kunemund
Attorney, Agent, or Firm—Nemschoff & Supnik

[57] ABSTRACT

Chemical vapor deposition apparatus has a quartz envelope supporting a resistance heater. A boron nitride pill box configured core supports resistance heater windings. The core has a base having a cylindrical upper portion defining a hollow chamber and an upper annular ring. A circular top includes an upper circular portion and lower circular portion mating with the base. The annular ring surface is in thermal contact with the upper circular portion to transfer heat from the annular ring to the circular top. A zirconia insulator cups the core, providing heat insulation, in conjunction with a heat shield coating in the quartz envelope interior. Arrays of quartz envelope heaters provide for mass production of semiconductors. A horizontal configuration includes a laminar flow head and disposed at an angle to the horizontal.

In use, a current applied to the windings develops high temperatures for chemical vapor deposition growing of semiconductors on substrates disposed above the envelope with minimal energy utilization. When heated, the heat is transmitted significantly upward along the annular surface of the core, then to the top of the core above the hollow chamber, where the heat is transmitted inwardly from adjacent the annular surface, achieving a generally flat temperature across the surface of the core's top and then maintains that uniform temperature, when the heat is transmitted to a substrate.

19 Claims, 5 Drawing Sheets

EPITAXIAL HEATER APPARATUS AND PROCESS

BACKGROUND OF THE INVENTION

1. Field of the Invention

This invention relates to devices and processes for metal organic chemical vapor deposition. More particularly, this invention pertains to a apparatus and methods for creating a generally flat temperature zone on a substrate for growing semiconductors.

2. Description of the Prior Art

In the past, chemical vapor deposition on substrates which achieved satisfactory yields has generally required devices of high energy consumption. Typically, a wafer of gallium arsenide is heated prior to and during vapor deposition through a system utilizing electromagnetic radiation or radio frequency induction heating. The costs of this equipment for generating heating for wafer deposition is high and the costs of operating is expensive as a result of high energy consumption and the inability to efficiently utilize and direct energy.

A system has been tried using a carbon block used as an electrical resistance heating element beneath a quartz support. One difficulty encountered with carbon block resistance heating is that there is a lack of uniformity in heating of the water, resulting in lower quality yields.

A low pressure MOCVD system has used a reactor having a hexagonal SiC coated graphite sample holder which is heated by quartz halogen lamps placed at its center. The lamps are enclosed in a double quartz walled jacket which isolates them from the sample holder. The walls of the substrate holder are slightly tilted backward toward the center of the holder and each face has recesses for 3 inch square wafers. A total of 30 to 50 wafers can be processed in a single run. Power to the lamps is controlled by a computer which monitors and controls power to maintain it at a constant level. An operator can observe temperature through a small "peephole" in the reactor chamber but there is no feedback temperature control. Temperature variations in this system are large and uncontrollable. The major disadvantage of this system is its high initial and process costs.

SUMMARY OF THE INVENTION

A chemical vapor deposition heater in accordance with this invention generally comprises an envelope which supports a heater core. The core establishes an annular heated region at which location heat is substantially concentrated. Means are provided for heating the core to raise the core temperature to develop heat at the annular region. A buffer or plate is disposed in thermal contact with and generally above the annular region to receive and buffer intense heat over a circular surface generally above and inward from the annular region, and thereby provide a uniformly heated surface over a substantially flat temperature range. This allows the placement of chemical vapor deposition substrates on the buffer which will be heated a substantial, yet highly uniform temperature across its surface.

In particular examples, the core has a resistance winding and defines a hollow chamber. The core supports a buffer in a pill box configuration.

Additional features in accordance with this invention includes an inert film heat shield on the interior of the envelope. The core is made of boron nitride and has a surrounding insulator or zirconia cupping the core. The buffer is against a quartz surface to assure uniform conduction to a platten for supporting a substate. The envelopes are of quartz. Multiple envelopes may be disposed in arrays for mass production of growing semiconductors. The heaters may be individually rotatable using mercury contacts for achieving even greater heating uniformity. A horizontal form of the heater has an elongated envelope and a core substantially upright adjacent one end of the envelope.

BRIEF DESCRIPTION OF THE DRAWINGS

A better understanding of the invention may be had in viewing the drawings taken in connection with the following description in which.

DETAILED DESCRIPTION

Figures 1, 2:
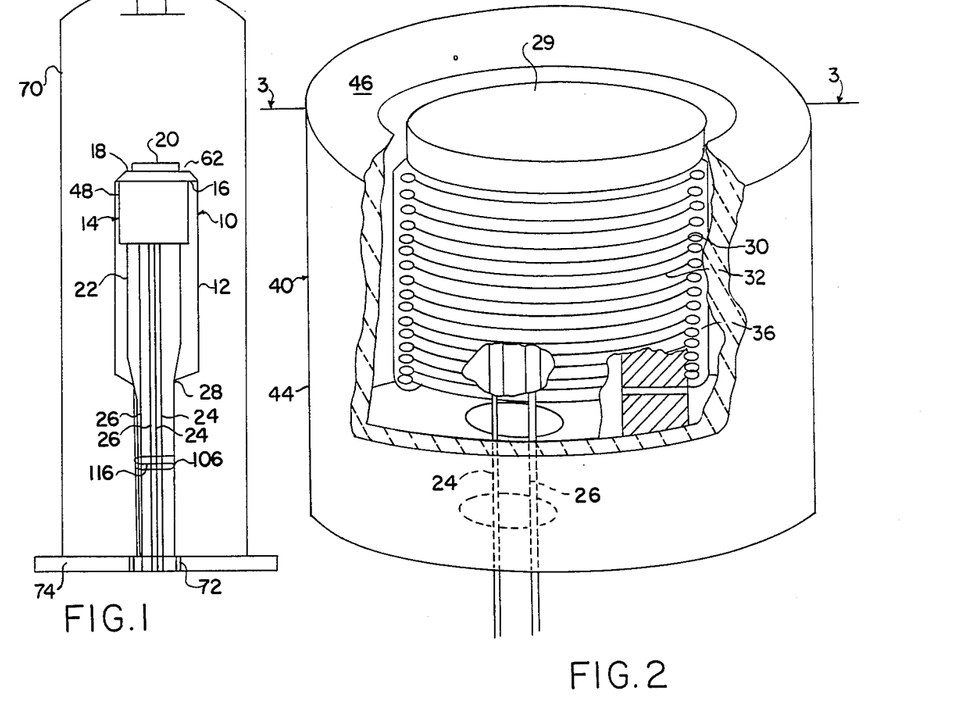
FIG. 1 is a diagrammatic elevational view of epitaxial heater apparatus in accordance with this invention.
FIG. 2 is a perspective view of a portion of the invention depicted in FIG. 1; with portions exposed and portions removed.
Figure 3:
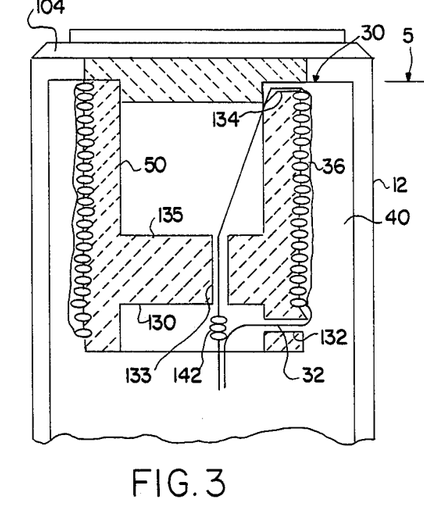
FIG. 3 is a detailed elevational view of a portion of the invention depicted in FIG. 1.
Figure 4:
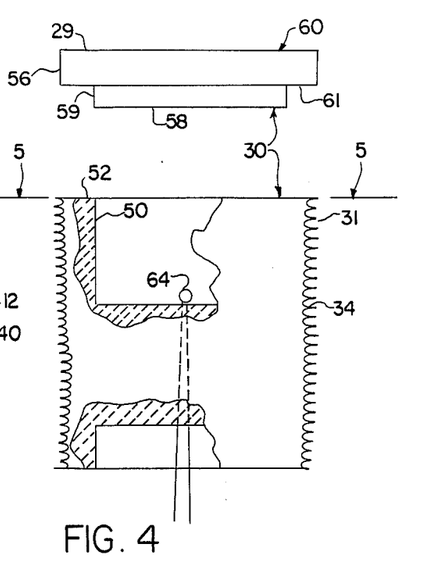
FIG. 4 is an exploded elevational view of a core of the invention depicted in FIG. 3.
Figure 5:
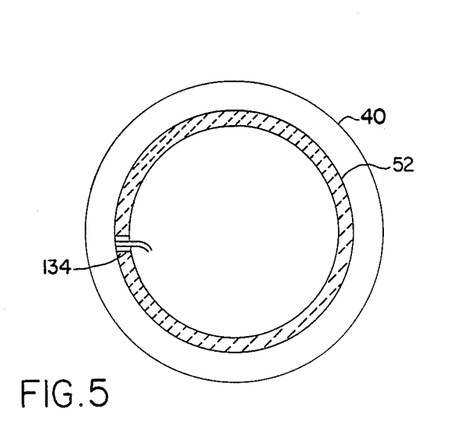
FIG. 5 is a plan view of a portion of the invention depicted in FIG. 1 taken along lines 5—5 of FIG. 4.

With particular reference to FIGS. 1, 2 and 3, a system for heating gallium arsenide substrates in accordance with this invention generally comprises a quartz envelope heater 10 which comprises a quartz envelope 12 and a resistance heater 14 disposed within the quartz envelope 12. The envelope 12 may be disposed in a separate environment or in combination with other envelopes. The resistance heater 14 is pinned up against an upper surface 16 of the quartz envelope 12, adjacent a quartz wafer support 18 where a substrate 20 is heated. At the bottom of the resistance heater 14 is a narrow elongated quartz support 22. Electrical power leads 24 and thermocouple leads 26 exit through the quartz support 22 at a heater base 28. The quartz envelope 12 shields both the resistance heater 14 and leads 24, 26, preventing contamination with the environment surrounding the quartz wafer support 18. Thus, process gases, when present, only come in contact with the exterior of the quartz envelope 12.

The resistance heater 14, best viewed in FIG. 2, comprises a boron nitride core 30 comprising a boron nitride top 29 and a boron nitride base 31 which is wrapped with a 20 mil. resistance winding 32 of platinum/20% Rhodium. Boron nitride is used for the core 30 because it has high thermal conductivity, good thermal stability, good electrical insulation and good machinability. Platinum/rhodium wire is used for resistance windings 32 because of its ability to withstand high temperatures. Alternatively for cost savings, molybdenum wire may be used for the resistance windings where the envelope 12 is evacuated. The core 30 has threaded grooves 34 achieved by lathing, to make it easier to wind the resistance windings uniformly and snugly. That construction permits a predictable temperature profile on the top surface of the heater 10 and improves the thermal contact between the resistance windings 32 and the core 30. After the resistance winding 32 is wrapped around the core heater 30, alumina cement 36 is applied which provides electrical insulation and increases thermal conduction from the resistance winding 32 to the boron nitride base 31. The cement 36 conducts heat, yet insulates electrically.

The heater 14 is supported by a cup shaped zirconia ceramic insulator 40 having a cylindrical outer surface 44 and a narrower cylindrical inner surface 46. A platinum foil reflector heat shield 48 surrounds the insulator and the boron nitride core 30. Rather than platinum foil, an inert reflective coating on the inside surface of the quartz envelope 12 may be used. The boron nitride core 30 has a pill box configuration defining a hollow cylindrical chamber 50 and an upper annular surface 52 at the top of the base 31 above and encircling the chamber 50. The boron nitride top 29 has an upper portion 56 having a diameter of that of the base 31 and a resistance winding 32 and a lower portion 58 coaxial with the upper portion 56 and a diameter mating with and insertable in the hollow cylindrical chamber 50 of the base 31. The lower portion 58 defines a ring surface 59 which bounds a lower annular surface 61 of the upper portion 56. The upper annular surface 52 of the base 31 energizes the lower annular surface 61 of the upper portion 56. The top 29 establishes a flat temperature zone 60 on its surface and on the quartz wafer support 18 as a result of the heated annular surface 52 at the top of the core 30. Only the annular surface 52 of the base 31 touches the boron nitride top 29.

Thus, heat is conducted efficiently from the base 31 to the perimeter of the boron nitride top 29 where heat then spreads radially inward in a manner so as to produce a uniform temperature across the surface of the top 29.

The balancing of efficient and inefficient heat conduction paths from the heater 14 to the boron nitride top 29 (plus convective heating in examples where the envelope 12 is not evacuated) yields the flat temperature zone on most of the top surface 62 of the quartz envelope 12. The base 31 of the resistance heater 14 contains a thermocouple 64 to measure the heater's temperature. The quartz envelope 12 shields the heater's functional parts from process gases and maintains the purity of the process. Power leads 24 as well as the thermocouple leads 26 exit the heater 14 through the narrow elongated quartz support 22, and argon, (where molybdenum wire is used) constantly purges the heater through an opening in the quartz envelope heater's base 28.

In an enclosed environment, the heater 10 is attached to the base of the reaction chamber 70 with a double O-ring seal 72. Though the heater is stationary, it may be configured for rotation. Multiple heaters 10 may be individually rotated and connected in parallel or separately to confined or individual power sources.

In one example, the operation of the envelope heater 10 was calibrated as follows. The top surface 60 temperature was measured simultaneously with that of the base of the core heater 14. The heater's top surface temperature could then be set by adjusting the core temperature. The calibration was performed under conditions similar to those for growing epitaxial material. The heater was attached with a double O-ring seal 72 to a base plate 74 on which the reaction chamber 70 is mounted. A silicon standard wafer 76 was then mounted on the top surface 62 of the quartz envelope 12. The reaction chamber 70 was then evacuated and filled with hydrogen gas flowing at the set rate of 5 standard liters per minute (SLPM). The core 30 was powered with a Rubicon power controller, which in turn was controlled by a Barber Coleman 560 three-mode proportional controller.

The temperature of the heater's top surface 62 was measured with an Ircon infrared pyrometer, which is sensitive to radiation between 2.0 and 2.6 micrometers. The pyrometer measured the radiation from the highly polished silicon wafer placed on the heater's top surface 62. Silicon has a known emittance of 0.7 and serves here as a reference for optically measuring the surface temperature of actual GaAs wafers. The optical properties of the reaction chamber walls encasing the heater 10 had to be considered in the measurement. The walls transmit only a fraction of the radiation emitted from the wafer 76. Therefore, the emitance was set on the pyrometer at 0.63, corresponding to a wall transmittance of 90 percent. A Pt/Pt-13% Rh thermocouple mounted in a recess at the core heater's base measured core temperature in degrees Celsius, using a digital theromouple readout.

Figure 6:
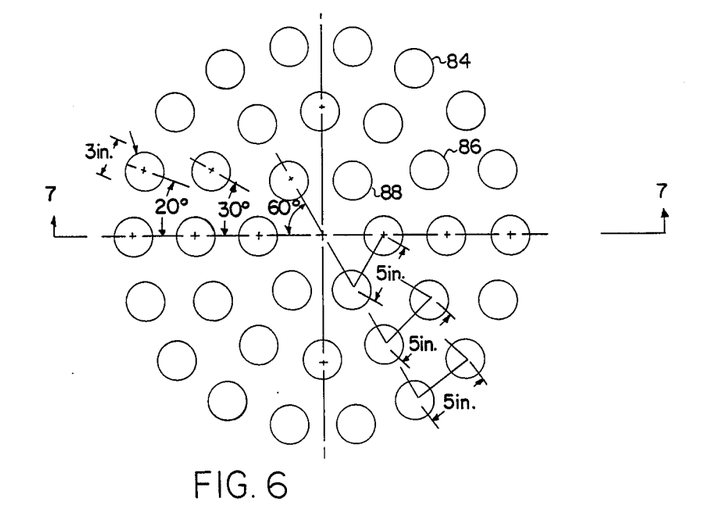
FIG. 6 is a plan view of an epitaxial heater array in accordance with this invention.
Figure 7:
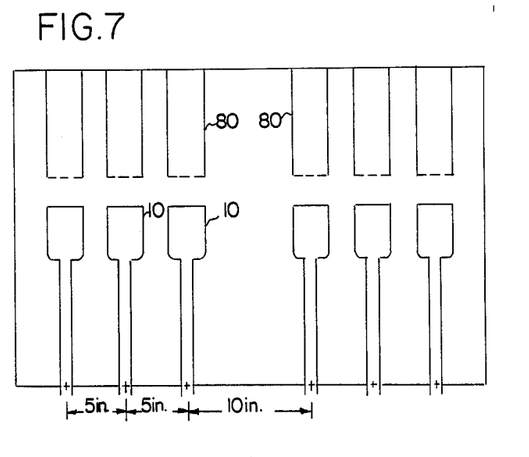
FIG. 7 is an elevational view of an epitaxial heater array taken along lines 7—7 of FIG. 6.

With reference to FIGS. 6 and 7, an array of quartz envelope heaters 10 in accordance with this invention are disposed in a circular array. A plurality of diffusers 80 or tubes for causing process gases to pass over the heater are disposed above and mate with the individual quartz envelope heaters 10 to cause reactant and dopant gases to be passed across the wafer substrates 76. The particular quartz envelope heater system shown and described can process thirty six 3" (7.6 cm.) diameter wafers at one time, and growth can be done at either low pressure or atmospheric pressure. These features are competitive with the prior art reactors, however, it has temperature control, better wafer to wafer uniformity, and minimizes waste of metal organic compounds and arsine during production runs. This last advantage results from directing the reactant vapor directly to the substrate surfaces. Much of the reactant vapors in the prior art systems, however, just pass through without being consumed to form epitaxial layers, which makes those systems inefficient and expensive to operate.

The array of heaters are disposed in a circular configuration in which 18 heaters each having a 3" diameter are disposed in an outermost circular array 84, spaced apart approximately 5 inches (12.7 cm.) center to center from one another. An adjacent middle circular array 86 of 12 such heaters are disposed on the interior and coaxial with the outer array. An adjacent inner circular array 88 of 6 such heaters are disposed on the interior of the middle circular array. Interference between heaters 10 is not critical as the heat energy of the heaters tends to be highly localized above the boron nitride core 30.

Subdividing a reactor chamber eliminates many problems which plague system using monolithic heaters, including maintaining thermal uniformity. Flow problems are minimized since each sample has its own chamber. Reactants are not be wasted and interfaces between layers would be sharper because reactants would be piped directly to each sample where a diffuser with a minimum volume would be used.

Figure 12:
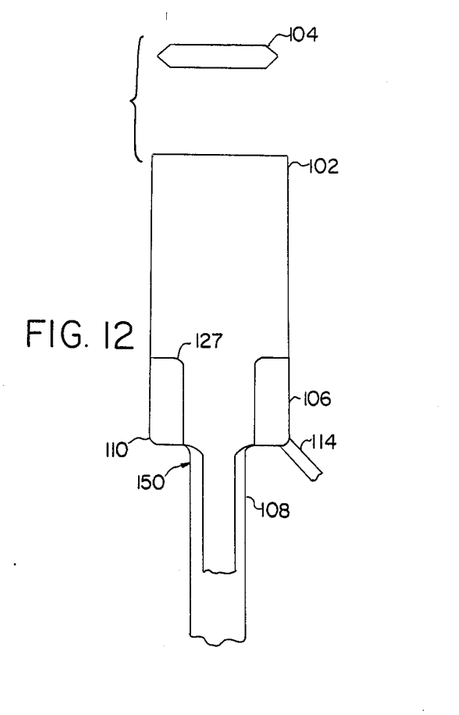
FIG. 12 is an exploded detailed view of quartz envelope heater of FIG. 10.

With particular reference to FIG. 12, the construction of the outer quartz envelope 12 includes a ⅛" (0.3 cm) plate 104 which provides the wafer support 18 and a 6" (15 cm.) long by 3" (7.6 cm) quartz tube 102 with a 2 mm. wall. Initially the tube 102 is open at both ends. The flat plate 104 is joined to the quartz tube 102 at one end to completely close it off at that end. The joining of the plate and tube is accomplished by first beveling the perimeter of the plate on its two sides so that its perimeter is thinned, leaving a beveled surface. The plate is held vertically in a lathe by a vacuum chuck and the open tube is held horizontally in the lathe adjacent to the plate. The two pieces are brought together with the edge of the plate pressed over the wall of the tube. Heat is then applied to seal the join. Once joined, a coating of platinum is formed on the inside wall of the tube. The coating extends from the bottom of the tube where the plate is joined to three inches above the plate. The platinum coating is applied as a chloroplatinic acid solution in rose oil. The rose oil acts to give the solution body. Two coatings are applied by brushing the solution on the inside wall of the tube. Following each application of solution the tube end plate is heated to 900 degrees C.

The midsection of the quartz envelope 12 consists of a ¾" (1.9 cm) tube 108 which is 12" long with a 3 mm. wall attached to a 1" inch length of 3" diameter tubing 106 with a 2 mm. wall by a quartz transition. The transition is accomplished by necking down the diameter of the larger tube to approximately ¾" and making a join to the smaller tubing 108. They are joined in a lathe by the application of heat. An opening is formed at the base 110 of the 3" tube where it is rounded to form the neck. At ¼" diameter by 3" long tube 114 is attached to the opening. This tube 114 is for evacuating the envelope 12 at the final stage of construction.

Figure 10:
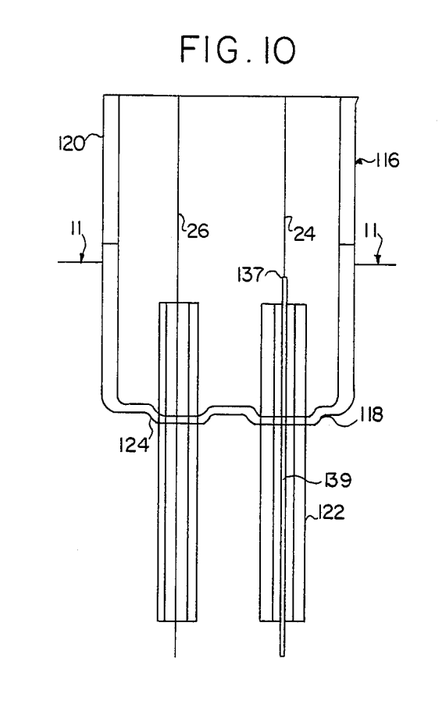
FIG. 10 is a cross-sectional view with portions exposed and removed of an electrical feedthru of the quartz envelope heater depicted in FIG. 1, in accordance with this invention.
Figure 11:
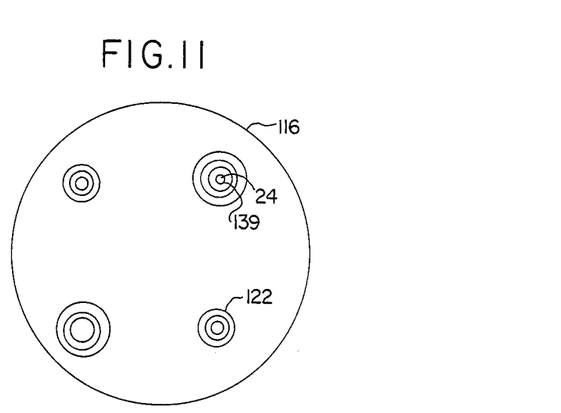
FIG. 11 is a bottom view of the feedthru depicted in FIG. 10.

At the base 31 of the heater 14 and the quartz envelope 12 is an electrical feedthru 116. It is a tube which is rounded and closed at its base 118 but open at its top 120. From base 118 to top 120 it is 2" long and has a 16 mm diameter. The top 120 of the feedthru is composed of quartz glass; the quartz glass extends one inch from the top of the feedthru 116. Next, there are seven layers or grades of glass which are layered until the base 118 is reached where there is uranium glass 124. Four covar feed thrus 122 are embedded in the uranium glass 124. They extend one inch into the tube and ½ inch outside the closed end of the tube. Two of the feedthrus 122 accept 0.100" heater wire and the other two tubes 122 accept 0.040" thermocouple wire. The pins or feedthrus are situated at the corners of an imaginary square with the larger pins and small pins diagonal to each other, as shown in FIGS. 10 and 11.

The inner quartz support tube or base 28 comprises a ½" quartz tube which is joined by a neck to a 2" long by 1" diameter quartz tube. The end of the 1" tube which is open has a flair with a 2" diameter. The flair is such that it nearly forms a flat surface perpendicular to the axis of the two tubes.

Support insulation for the resistance heater 14 is formed from zirconia supporting the core 30. The insulation serves to center the heater 14 in the quartz envelope adjacent the upper surface 16 and acts as a cushion between the quartz support 28 and the core 30. The insulation form is constructed as follows. Flat ½" thick boards of zirconia insulation are cut with cooky cutters by pressing them into a flat board to form three 2½"×½" discs. Two of the discs are in turn cut with a 2.16" cooky cutter to form two rings with a 2.16" ID and a 2½" OD. The two rings are stacked one on top of another and in turn the two rings are stacked on the 2½" solid disc. High temperature alumina cement is placed between the individual parts before they are stacked and excess cement is removed by pressing the three parts together tightly by hand. The cement joints are then air dried.

The boron nitride core heater 30 comprises two parts, the boron nitride base 31 and the boron nitride top 29. The boron nitride top 29 top fits integrally onto the boron nitride base 31 to form a "pill box" like structure.

The boron nitride base 31 has two opposing cylindrical cavities 50, 130 with a flat 0.375" thick floor 135 separating them. The cylinders have an OD of 2.160". The top cylindrical cavity or chamber 50 is 0.625" deep by 1.850" in diameter while the bottom cavity 130 is ¼" deep by 1.580" in diameter. The cavities 50, 130 are formed on a lathe with a boring bit. A 0.050" wide by 0.060 deep thread 34 is formed on the OD of the two cavities so that it extends from top to bottom of the OD of the boron nitride base. The pitch of the thread is such that there are 12 threads per inch. One 0.040" aperture 132 is made a 1/16" from the bottom of the boron nitride base and another 0.040" aperture 133 is made in a floor 135 separating the two cylindrical cavities 50, 130. The two apertures 50, 130 oppose each other and are situated on a diameter of the base 31. A notch 134 is filled at the top of the upper cavity 50 about one inch counterclockwise from the floor 135 separating the cavities (looking down at the cavity).

The boron nitride top 29 is a cylindrical disc with a 2.160" OD by 0.312" thick. The boron nitride top disc 29 has a 0.16" of material removed from the OD to a height of 0.125". The material has been removed so that the top can snuggly fit into and cover the deeper cylindrical cavity or chamber 50.

A 0.035" molybdenum wire is fed though the aperture 132 at the bottom of the boron nitride base 31 wrapped in the thread grooves 34, placed in the notch 134 at the top of the boron nitride base 31 and finally fed through the aperture 133 in the boron nitride floor 135. The wire is then threaded through a 4 aperture rod of alumninum which acts as a support to hold the wires and boron nitride base 31 while high temperature alumina cement 36 is applied. The threads and wire in the threads are coated with high temperature alumina cement to hold the wire in place. The cement is air dried.

The 4 aperture rod is removed. A 0.060 aperture is drilled in the wall separating the two chambers at its exact center. A chromel-alumel thermocouple bead 140 is placed just through the aperture and cemented. The cement is air dried.

The two thermocouple 26 and two heater wires 24 are brought together in a bundle. Alumina fish spine beads 142 are placed on all wires 24, 26 above where they come together to form a bundle. The wires 24, 26 are covered from the point of bundling up till they form a part of the boron nitride base 31. The bundled wire can now be fed through a 6" length of 4-aperture alumina rod.

Two 6" lengths of 0.100 precision ground OFHC copper each with a 0.040" inch diameter by ⅜" aperture 137 drilled at one end are attached to the edge of the molybdenum wire 24. The wire is placed into the apertures, the copper rod 139 is crimped and silver solder is placed at the junction of the wire and the top of the copper rod. A ⅛" nextel sleeving is placed over the copper rods and 0.040 nextel sleeving is placed over the two thermocouple leads 26. A ¼" aperture 148 is formed at the base of the zirconia insulator 40 previously described. The 4 leads from the heater 14 plus the 4 aperture rod are placed through the aperture in the base of the zirconia insulator 40 so as to allow the base 31 to be cupped in that structure. The copper rod is used to reduce overheating of the feedthrus.

The 4 leads from the heater 14 plus the 4 aperture rod are placed through the inner quartz support tube so that the flair 127 is pressed up against the bottom of the zirconia insulator 40.

The inner quartz support tube 22 with zirconia insulator 40 and boron nitride base 31 and top 29 are placed inside the quartz midsection 150.

The thermocouple wire 26 and copper rods are guided through the electrical feedthru 116. The feedthru 116 and midsection 150 are permanently joined. Copper rods and thermocouple wires 26 are attached to feedthrus by applying silver solder.

The quartz top 104 is joined to the midsection so that the boron nitride top 29 contacts the flat quartz plate 104 firmly. The quartz envelope heater 10 is evacuated with a vacuum pump by attaching the pump to the ¼" vacuum tube at the base of the 3" diameter top.

Power is applied to the heater and is increased while monitoring pressure of the heater and pump. The power is only applied to the molybdenum wires. Once the pressure has stabilized almost all water has been removed from the alumina cement and it is cured.

Finally, power is removed and the side arm vacuum tube is sealed.

Figures 8, 9, 13, 14:
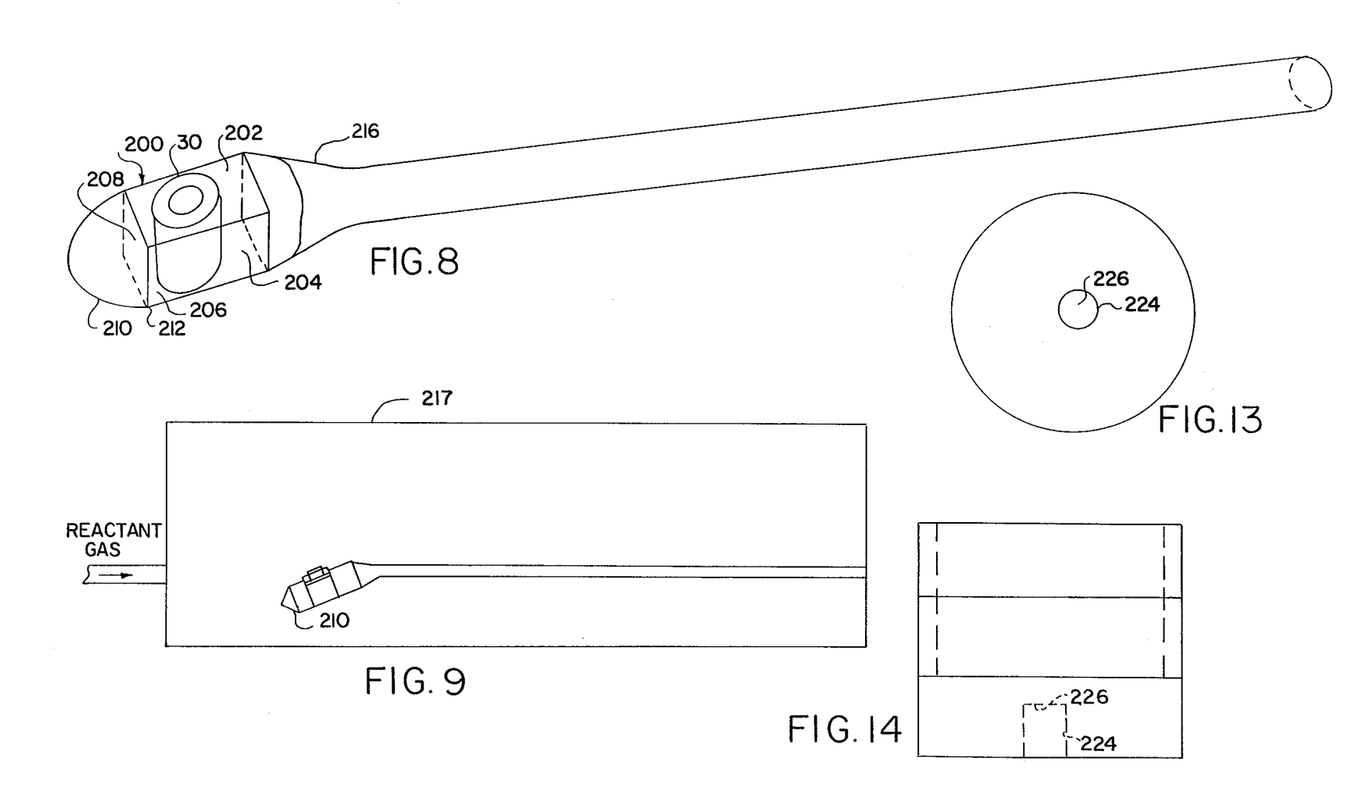
FIG. 8 is a diagrammatic view of a horizontal epitaxial heater apparatus in accordance with this invention.
FIG. 9 is a horizontal epitaxial heater apparatus disposed in a reaction chamber, in accordance with this invention.
FIG. 13 is a bottom view of the zirconia insulation of the horizontal heater depicted in FIG. 8.
FIG. 14 is a cross-sectional elevational view of the zirconia heater depicted in FIG. 13.

With particular reference to FIGS. 8 and 9, a horizontal quartz envelope heater in accordance with this invention may be constructed having a square quartz tube 200 with flour flat faces or sides 202, 204, 206 and 208. The top face 202 is ground to form a 2"×0.020" deep depression which is flat at its bottom. The depression is centered on the top face. Other than the depression, the four faces are flat both on the inside and outside of the square tube. The square tube is initially open at both ends but is then closed off at one end with a hollow bullet shaped end cap 210 composed of quartz. The transition 212 from the bullet shaped end-cap to the square tubing is smooth. The square tubing is approximately 3"×3" long. The bullet shaped end cap is approximately 1" long. The side walls and base but not the top are internally covered with chloroplatinic acid solution in rose oil and baked for platinum coating.

The transition to a midsection 216 is at an angle to the square tube 200. projection of the top surface and open end of the square tub shows that the two surfaces are originally 90 degrees with respect to each other where the intercept of the two surfaces forms the origin. If the open end is at 0 degrees then by rotating an imaginary line about the origin by 15 degrees clockwise and cut the square tubing at this angle with a silicon carbide blade.

The midsection 216 of the quartz envelope is constructed of ¾" diameter tube with a 3 mm which is 12" long attached to a 1" long piece of 3" by 3" square tubing by a quartz transition. The midsection is joined to the square tube 200 at an angle defining an interception plane. The top face 202 defines a plane and the intersection of the top face plane and the interception plane is at an angle of 75 degrees. The effect of this is to permit the placement of the heater within a reactor 217 so that the heater can support a wafer substrate at an angle to the horizontal, allowing process gases to better be passed more directly across the wafer substrate, as best viewed in FIG. 9.

The transition 216 is fabricated by necking down and rounding a square tube, which is initially longer than 1", until a round end of ¾" diameter is formed. This is fabricated by holding the square piece in the lathe, rotating it, applying intense heat and shaping it with a carbon flatstock. Once the square quartz tube has been necked down and rounded it is mated to the ¾" diameter by 12" tube. An opening is formed at the base of the 3"×3" tube where it is rounded to form the neck. A ½" diameter by 3" long evacuation tube is attached to this opening. This tube is used for evacuating the heater envelope at the final stage of heater construction. The base 31 uses electrical feedthrus as with the vertical heater. No inner quartz tube, such as the quartz support 22 in the prior example, is necessary.

The shape of the zirconia insulator 40 is the same as for the vertical heater 10. However, a ¼" diameter by ⅛" aperture 224 with a flat bottom 226 is drilled at the center of the base of the zirconia structure, the underside of the solid disc, as shown in FIGS. 13 and 14.

Figure 15:
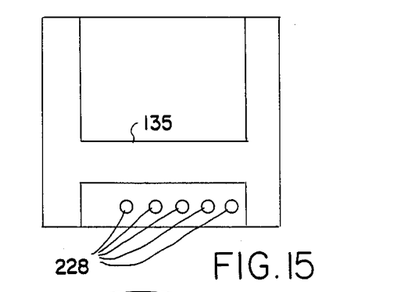
FIG. 15 is a cross-sectional elevational view of the boron nitride core of FIG. 8.
Figure 16:
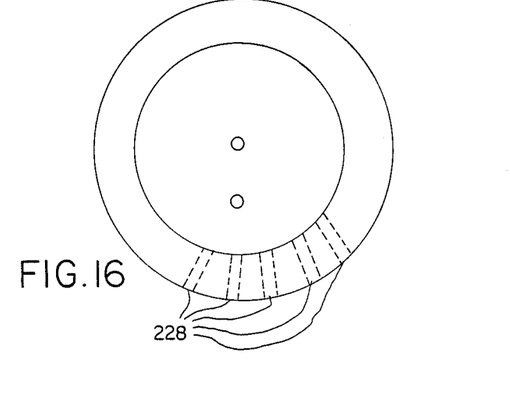
FIG. 16 is a cross-sectional plan view of the boron nitride core depicted in FIG. 15.

With particular reference to FIGS. 3, 15 and 16, the boron nitride core 30 is the same as for the vertical heater 10, except for the number of apertures. Five 0.040 apertures 228 are made 1/16" from the bottom of the boron nitride base 31 a ¼" apart, and another 0.040" aperture is made in the floor separating the two cylindrical cavities 50, 130. A 0.040" notch 230 is filled at the top of the larger cylindrical cavity 50 about an inch counter clockwise of the aperture in the wall separating the two cavities (looking down at the larger cavity).

A 0.035" molybdenum wire is fed into the second aperture from the right in the cylindrical cavity wall of the smaller cavity of the boron nitride base 31 (side view of the boron nitride base and apertures) so that the wire 232 enters the smaller cylindrical cavity, and is looped through the first aperture on the right, in the floor 135 of the boron nitride base 31. The wire is then wrapped into the thread grooves 34, placed in the notch 134 at the top of the boron nitride base 31 and fed through the aperture in the boron nitride floor 135 that separates the two cavities. Fish spine beads are placed on the wire in a quantity to cover any bare wire extending from the aperture in the floor to the third aperture in the wall of the small cylindrical chamber. The wire is then guided through this third aperture. As in the vertical heater 10, high temperature alumina cement is used to hold the wires to the base 31 of the core 30 and achieve temperature conduction.

A 0.060" aperture is drilled through the floor separating the two cylindrical cavities at its exact center. A chromel-alumel thermocouple bead is placed just through the aperture and cemented in place. The cement is air dried. The two thermocouple leads 26 are placed through the two remaining apertures in the wall of the small cylindrical cavity of the boron nitride base but first they are covered with fish spine beads so that the wire is covered between the aperture at the center of the floor of the boron nitride base and the wall of the cylindrical cavity. Enough fish spine beads are placed on the four wires to cover 4". The wire covered is external to the boron nitride base 31.

A ¼" aperture is drilled through the side of the zirconia insulator 40 about 9/16 from its base. The thermocouple leads 26 and molybdenum wire are bundled together and fed along with the four inches of fish spine beads through the aperture in the zirconia insulator 40 so as to allow the boron nitride base 31 to be cupped in the insulator 40.

The four wires are fed into and through a 6" long 4 aperture alumina rod. Copper rods 139 and molybdenum wire 24 are joined. Nextel sleeving is placed over uninsulated parts.

The boron nitride base 31 and zirconia insulator 40 are placed into the square quartz top so that they are centered with respect to the depression ground into the top surface. The top of the heater 12 is just below the depression. The square tube 299 and heater 14 are turned together so the bottom faces up. Heat is applied with a torch to the glass above the aperture in the bottom of the zirconia insulator 40. The quartz glass is softened and then pushed into the aperture in the insulation. This pins the heater assembly against the top quartz surface. Much of the remaining structure is similar to that of the horizontal heater.

Heat is applied to the dimple which pins the package in place, made at the base of the quartz top. The vacuum will further pull the quartz into the aperture in the base of the zirconium insulator 40 and firmly pin the boron nitride top 29 against the top surface 16.

Thus, a system for growing epitaxial layers has been described which utilizes envelope heaters to mass produce semiconductor epitaxial wafers by efficiently bringing reactants directly to the surface of the substrates. Uniformity is facilitated by temperature feedback to control banks of heaters.

While this disclosure describes the use of the quartz envelope heater system to produce MOCVD epilayers of GaAs and $Ga_{1-x}Al_xAs$, it is possible for this system to be used to produce other materials by MOCVD or other CVO techniques.

The quartz envelope may be replaced with a mullite envelope, or alumina envelope and other materials which are inert to the reactive gases. A molybdenum envelope may also be used, which is embedded in quartz. This could provide more thermal uniformity, molybdenum being a metal, yet it does not dope semiconductors, while quartz can. It is also possible to coat the quartz with alumina and other materials by plasma spraying. A platten of iridium or other nonreacting metal or discs of silicon, sapphire, and the like on the top surface of the heater may be used to flatten the temperature profile more and to protect the heater's surface from reactants. The heater's surface is then always clean and only the platen or nonmetalic discs need to be cleaned.

The expense of the heater can be reduced significantly by replacing the Pt-20% Rh wire winding with tungsten or molybdenum wire and replacing the platinum heat reflector shield with gold reflector or platinum coating that can be formed by the application of a colloidial gold suspension to the envelope, which is then baked.

While the invention has been described with reference to specific forms thereof, it will be understood that changes and modifications may be made within the spirit and scope of this invention.

What is claimed is:

1. A chemical vapor deposition system comprising:
    envelope means for supporting a heater core, the envelope means having an exterior substrate surface for supporting a semiconductor substrate;
    core means within the envelope means for establishing and directing heat to an annular heated region;
    an annular heating region defined by the core means;
    heating means adjacent the core means for raising the temperature of the core means at the annular region of the core; and
    buffer means for distributing heat applied from the core means and providing uniform heating to the exterior substrate surface, the buffer means disposed above and in thermal conductive relationship to the core means for receiving heat from the annular heated region of the core and thereby allowing radially directed heat distribution and providing a uniformly heated surface over a flat temperature range; and
    support insulation means for supporting and cushioning the core means, the support insulation means pinning the core means against the buffer means and the buffer means against the envelope means.

2. The invention as set forth in claim 1 and in which the heater means for raising the temperature of the core means comprises resistive windings disposed about the core means.

3. The invention as set forth in claim 1 and in which the core means comprises a hollow cylindrical tube portion and the heater means comprises windings about the hollow cylindrical tube portion.

4. The invention as set forth in claim 3 and in which the core has a cylindrical portion and a hollow chamber and comprises material selected from the group consisting of boron nitride, pyrolytic boron nitride and pyrifolyte.

5. The invention as set forth in claim 4 and in which the envelope means comprises an array of envelopes for multiple simultaneous growth of semiconductors by chemical vapor deposition, and a matching array of diffusors for supplying process gases to pass over matching heaters, the array of diffusors disposed in mating relationship with the individual envelopes, for causing reactant and dopant gasses to be passed directly across substrates when substrates are disposed on the envelopes.

6. The invention as set forth in claim 4 and comprising:
    a inert shield disposed on the interior of the envelope means;
    a high temperature, giving electrical insulator and heat conductive material supporting the core; and
    an inert platten disposed above the buffer means defining a wafer surface for supporting a wafer.

7. A chemical vapor deposition system comprising:
    an inert envelope for supporting a heater;
    the envelope having an exterior substrate surface on the envelope exterior for supporting a semiconductive substrate;
    the envelope having an inner upper surface adjacent the exterior substrate surface;

a core within the envelope for establishing and directing heat to an annular heated region, the core having a cylindrical portion defining a hollow chamber and a top, the cylindrical portion defining an upper annular surface, the top defining a lower annular surface mating in thermal conducting relationship with the upper annular surface;

resistance windings disposed about the cylindrical portion for raising the temperature of the core means at the upper annular region of the core; and the top providing a uniformly heated surface for heat conduction to the semiconductor substrate surface, the top disposed above and in thermal conductive relationship to the core means for receiving heat from the annular heated region of the core and thereby allowing radially directed heat distribution and providing a uniformly heated surface over a flat temperature range; and support insulation means for supporting and cushioning the core means against the top and the top against the inner upper surface of the inert envelope, the support insulation means comprising zirconia, and defining a cup supporting the heater means.

8. The invention as set forth in claim 7 and in which the quartz envelope is evacuated, and the resistive windings comprise molybdenum wire.

9. The invention as set forth in claim 8 and comprising a heat shield disposed on the inside of the quartz envelope.

10. The invention as set forth in claim 8 and comprising a reaction chamber surrounding the envelope and a wafer for growing a semiconductor disposed on the top of the core, separated from the core top by an inert material, yet in thermal contact with the core top.

11. The invention as set forth in claim 10 and comprising a thermocouple disposed on the core, the core having means for receiving thermocouple wires, and feedthru means for communicating leads of the resistance windings and of the thermocouple external to the quartz envelope.

12. The invention as set forth in claim 11 and in which the quartz envelope has a horizontal configuration, the invention further comprising means for support a substrate at an acute angle to the horizontal plane for allowing passage of process gases across a substrate directly and with a laminar flow.

13. A chemical vapor deposition system comprising:
an inert envelope for supporting a heater; the envelope having an exterior substrate surface for supporting a semiconductor substrate and an inner upper surface;

a core within the envelope for establishing and directing heat to an annular heated region, the core having a cylindrical portion defining a hollow chamber and a top, the cylindrical portion defining an upper annular surface, the top defining a lower annular surface mating in thermal conducting relationship with the upper annular surface;

insulation means for supporting and cushioning the core, the insulation means pinning the core against the inner upper surface;

resistance windings disposed about the cylindrical portion for raising the temperature of the core means at the upper annular region of the core;

an inner support disposed beneath the heater for supporting the heater against the upper surface of the inert envelope;

wire leads extending from the core through the support; and in which the top providing a uniformly heated surface beneath the inner upper surface of the envelope, the top disposed above and in thermal conductive relationship to the core means for receiving heat from the annular heated region of the core and thereby allowing radially directed heat distribution and providing a uniformly heated surface over a flat temperature range.

14. The invention as set forth in claim 13 and comprising:
a thermocouple disposed on the core;
means disposed on the core for passing the windings of the core through the core; and in which
the inner support bearing on the interior of the envelope for urging the heater upward toward the upper surface of the envelope.

15. The invention as set forth in claim 14 and in which the envelope is disposed in a reaction chamber;
a plurality of envelopes, each having heater cores,
a matching array of diffusors for supplying process gases to pass over matching heaters, the array of diffusors disposed in mating relationship with the individual envelopes, for causing reactant and dopant gasses to be passed directly across substrates when substrates are disposed on the envelopes;
each core having a hollow depression;
a platen for supporting a substrate above the envelopes; and
a wafer disposed on each platen.

16. The invention as set forth in claim 15 and in which the quartz envelope is evacuated and in which the resistance windings comprise molybdenum; and further comprising:
feedthrus for transmitting electricity to a thermocouple and to the resistance windings;
substantially inert metal tubes for passing electrical leads through the feedthrus; and
copper rod means disposed within the metal tubes for reducing electrical resistance through the feedthrus and to thereby reduce the dissipated heat at the region of the feedthrus.

17. The invention as set forth in claim 1 and in which the envelope means is evacuated.

18. The invention as set forth in claim 17 and in which the support insulation means comprises zirconia.

19. The invention as set forth in claim 18 and in which the support insulation means defines a cup supporting the heater means.

* * * * *